United States Patent
Chang et al.

(10) Patent No.: US 9,780,026 B2
(45) Date of Patent: Oct. 3, 2017

(54) INTERCONNECTION STRUCTURE AND METHOD OF FORMING THE SAME

(71) Applicant: TAIWAN SEMICONDUCTOR MANUFACTURING CO., LTD., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/131,608

(22) Filed: Apr. 18, 2016

(65) Prior Publication Data

US 2017/0221812 A1 Aug. 3, 2017

Related U.S. Application Data

(60) Provisional application No. 62/289,137, filed on Jan. 29, 2016.

(51) Int. Cl.
| | |
|---|---|
| *H01L 23/52* | (2006.01) |
| *H01L 29/40* | (2006.01) |
| *H01L 21/4763* | (2006.01) |
| *H01L 21/44* | (2006.01) |
| *H01L 23/522* | (2006.01) |
| *H01L 23/528* | (2006.01) |
| *H01L 21/768* | (2006.01) |
| *H01L 23/532* | (2006.01) |

(52) U.S. Cl.
CPC .... *H01L 23/5226* (2013.01); *H01L 21/76804* (2013.01); *H01L 21/76832* (2013.01); *H01L 21/76877* (2013.01); *H01L 23/5283* (2013.01); *H01L 23/5329* (2013.01)

(58) Field of Classification Search
CPC ......... H01L 21/76804; H01L 21/76805; H01L 21/76807; H01L 21/76846; H01L 21/76877; H01L 21/76897; H01L 21/823475; H05K 2201/09854; H05K 2201/09863
USPC ................ 438/637–640, 642, 672, 673, 675; 257/774–776
See application file for complete search history.

(56) References Cited

U.S. PATENT DOCUMENTS

| | | | |
|---|---|---|---|
| 2008/0054304 A1* | 3/2008 | Sadaka | ............... H01L 27/0605 257/194 |
| 2014/0199835 A1* | 7/2014 | Yen | ......................... B81B 7/007 438/668 |

* cited by examiner

*Primary Examiner* — Hsien Ming Lee
(74) *Attorney, Agent, or Firm* — Cooper Legal Group, LLC

(57) ABSTRACT

An interconnection structure includes a non-insulator structure, a liner layer, a dielectric structure and a conductive structure. The liner layer is present on the non-insulator structure and has an opening therein. The dielectric structure is present on the liner layer. The dielectric structure includes a via opening therein. The conductive structure is present in the via opening of the dielectric structure and electrically connected to the non-insulator structure through the opening of the liner layer. At least a portion of the conductive structure tapers along a direction from the non-insulator structure to the dielectric structure.

20 Claims, 4 Drawing Sheets

INTERCONNECTION STRUCTURE AND METHOD OF FORMING THE SAME

PRIORITY CLAIM AND CROSS-REFERENCE

This application claims priority to U.S. Provisional Application Ser. No. 62/289,137, filed Jan. 29, 2016, which is herein incorporated by reference.

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, numerous challenges have risen. For example, interconnection of conductive lines and associated dielectric materials that facilitate wiring between the transistors and other devices play a more and more important role in IC performance improvement.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
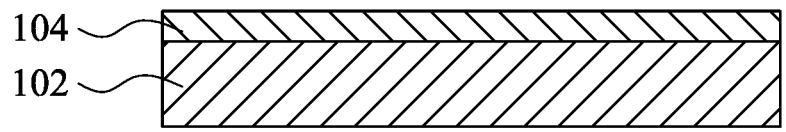
FIGS. 1 to 8 are cross-sectional views of a method for manufacturing an interconnection structure at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 to 8 are cross-sectional views of a method for manufacturing an interconnection structure at various stages in accordance with some embodiments of the present disclosure. Reference is made to FIG. 1. A liner layer 104 is formed on a non-insulator structure 102. The non-insulator structure 102 refers to a structure formed of one or more non-insulator materials, polysilicon, metal, conductive materials, semiconductor materials or combinations thereof. The non-insulator structure 102 can serve as a gate electrode, a source/drain region of a semiconductor device, such as a fin field effect transistor (FinFET).

In some embodiments, when the non-insulator structure 102 serves as the gate electrode of the FinFET, the non-insulator structure 102 may be formed by a gate last process. An exemplary gate last process may include forming a dummy gate structure including a material, such as polysilicon, on a semiconductor fin, forming spacers including a material, such as silicon oxide, silicon nitride, silicon oxynitride, silicon carbide, beside the dummy gate structure, removing the dummy gate structure to form a trench between the spacers, and forming at least one metal layer into the trench between the spacers to from the non-insulator structure 102. The metal layer may include a metal material suitable for forming the gate electrode or a portion thereof, including, work function layers, liner layers, interface layers, seed layers, adhesion layers, barrier layers and so on. In some embodiments, the metal layer may include suitable metal, such as TiN, WN, TaN, or Ru, which performs in a p-type FinFET. In some alternative embodiments, the metal layer may include suitable metal, such as Ti, Ag, Al, TiAl, TiAlN, TiAlC, TiAlCN, TaC, TaCN, TaSiN, Mn, or Zr, which performs in an n-type FinFET.

In some embodiments, when the non-insulator structure 102 serves as the source/drain region, an exemplary formation process may include doping an n-type dopant, such as phosphorous, or a p-type dopant, such as boron, into at least one portion of the semiconductor fin not covered by the spacers and the gate electrode by using ion implantation. Another exemplary process of forming the source/drain region may include forming at least one source/drain recess in the fin adjacent to the spacer, forming a seed layer in the source/drain recess, forming a relaxed epitaxial layer on the seed layer in the source/drain recess, forming an epitaxial layer on the relaxed epitaxial layer in the source/drain recess, so that the seed layer, the relaxed epitaxial layer and the epitaxial layer form a source/drain stressor to serve as the source/drain region. In some embodiments, the source/drain stressor includes, for example, SiP, SiP or SiCP, which is able to induce a tensile strain to the n-type channel in the semiconductor fin. In some other embodiments, the source/drain stressor includes SiGe, which is able to induce a compressive strain to the p-type channel in the semiconductor fin.

The liner layer 104 may serve as an etch stop layer, which protects the non-insulator structure 102 during an etching process of forming a via opening, an etching process of forming a trench opening or both of them. In some embodiments, the liner layer 104 may include a dielectric material, such as silicon carbide, silicon nitride or carbon-doped silicon nitride. In some embodiments, the liner layer 104 may include a conductive material, such as Ti, TiN, TiC, TiCN, Ta, TaN, TaC, TaCN, W, WN, WC, WCN, TiAl, TiAlN, TiAlC, or TiAlCN. In some embodiments, the liner layer 104 may be deposited using chemical vapor deposition (CVD), high density plasma (HDP) CVD, sub-atmospheric CVD (SACVD), molecular layer deposition (MLD), sputtering, physical vapor deposition (PVD), plating, or other suitable techniques. For example, in some embodiments, the MLD process is carried out under a pressure less than about 10 mTorr and in the temperature range from about 350° C. to about 500° C. In some embodiments, the silicon nitride is deposited on the top surface of the non-insulator structure 102 by reacting a silicon source compound and a nitrogen source. The silicon source compound provides silicon to the deposited silicon nitride and may include silane ($SiH_4$) or tetrathoxysilane (TEOS). The nitrogen source provides nitrogen to the deposited silicon nitride and may include ammonia ($NH_3$) or nitrogen gas ($N_2$). In some other embodiments, the carbon-doped silicon nitride is deposited on the top surface of the non-insulator structure 102 by reacting a carbon source compound, a silicon source compound, and a nitrogen source. The carbon source compound may include an organic compound, such as a hydrocarbon compound, e.g., ethylene ($C_2H_6$).

Figure 2:
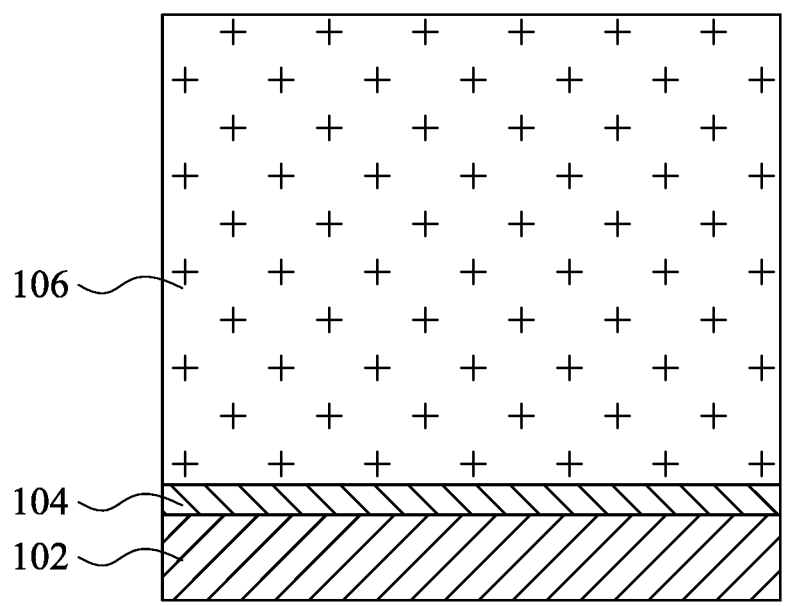

Reference is made to FIG. 2. A dielectric structure 106 is formed on the liner layer 104. In other words, the liner layer 104 is present between the dielectric structure 106 and the non-insulator structure 102. The dielectric structure 106 may be an interlayer dielectric (ILD) layer that includes a dielectric material. The dielectric material may include tetrathoxysilane (TEOS), an extreme low-k (ELK) dielectric material, nitrogen-free anti-reflective coating (NFARC), silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), Xerogel, Aerogel, amorphous fluorinated carbon, Parylene, BCB (bis-benzocyclobutenes), polyimide, or any combination thereof. The ELK dielectric material has a dielectric constant less than, for example, about 2.5. It is understood that the dielectric structure 106 may include one or more dielectric materials and/or one or more dielectric layers. In some embodiments, the dielectric structure 106 may be deposited on the liner layer 104 by CVD, HDP CVD, SACVD, spin-on, sputtering, or other suitable techniques.

Figure 3:
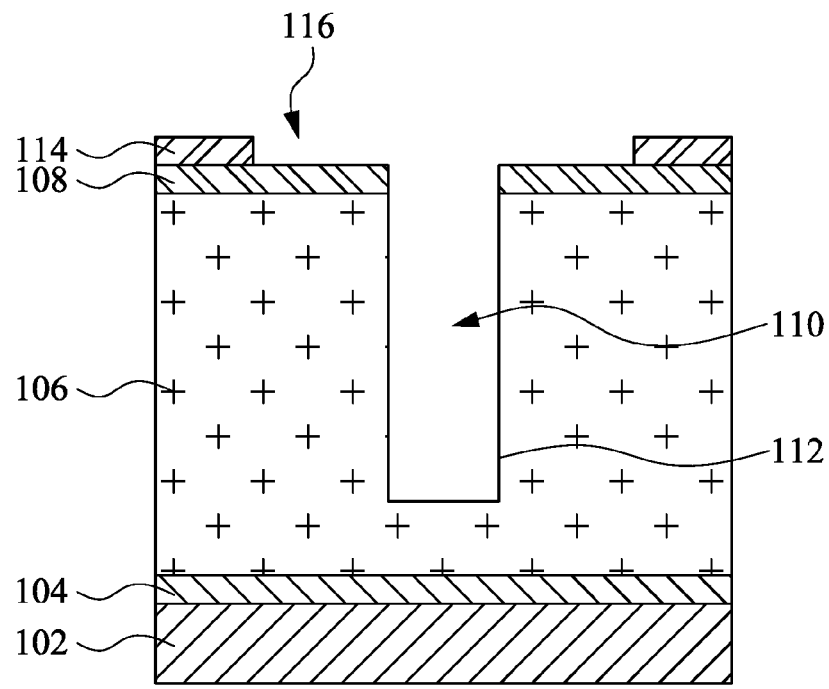

Reference is made to FIG. 3. An anti-reflection layer 108 is formed on the dielectric structure 106. The anti-reflection layer 108 may be formed of a nitride material, an organic material, an oxide material and the like. The anti-reflection layer 108 may be formed by using suitable techniques, such as CVD.

An etching process is performed to the dielectric structure 106 to form a recess 110 therein, and the liner layer 104 is not exposed in the recess 110. In other words, the dielectric structure 106 is recessed until reaching a level above the liner layer 104. Stated differently, the etching process does not etch through the dielectric structure 106 to expose the liner layer 104. Therefore, at this step, the liner layer 104 is not etched or damaged, so that a byproduct of etching the liner layer 104 is not generated during this etching process. As such, no byproduct is adhered to an inner surface 112 of the recess 110 during the etching process. An exemplary formation process of the recess 110 is described as follows. A photoresist layer (not shown) may be formed over the dielectric structure 106 and then patterned to form a photoresist mask with the image of the recess 110. Using the photoresist layer as a mask, the pattern of the recess 110 is then etched into the dielectric structure 106. After the etching process, the photoresist mask is removed by, for example, oxygen plasma ashing. The etching process of forming the recess 110 is stopped before the liner layer 104 is exposed, so that a portion of the dielectric structure 106 remains between the recess 110 and the liner layer 104 at this step. Such a remaining portion of the dielectric structure 106 can protect the liner layer 104 from being etched or damaged, thereby preventing the byproduct of etching the liner layer 104 from adhered to the inner surface 112 of the recess 110. In some embodiments, the etching process may be a dry etching, wet etching and/or plasma etching process. For example, the etching process of forming the recess 110 may employ a mixture of tetrafluoromethane ($CF_4$), trifluoromethane ($CHF_3$) and oxygen as the etching gases.

A mask layer 114 may be formed on the anti-reflection layer 108. The mask layer 114 has an opening 116. The opening 116 exposes a portion of the anti-reflection layer 108, so that an etching process can be performed to the exposed portion of the anti-reflection layer 108 and the underlying portion of the dielectric structure 106 to form a trench opening in a subsequent process. In some embodiments, the mask layer 114 may be a hard mask, such as silicon nitride ($Si_3N_4$), which has relatively high etching resistivity compared to the anti-reflection layer 108 and the dielectric structure 106. Formation of the hard mask may be performed by, such as, a CVD process. In some other embodiments, the mask layer 114 may be a photoresist layer. Formation of the mask layer 114 includes forming a photoresist layer on the anti-reflection layer 108 and then patterned to form a photoresist mask with the image of the opening 116.

Figure 4:
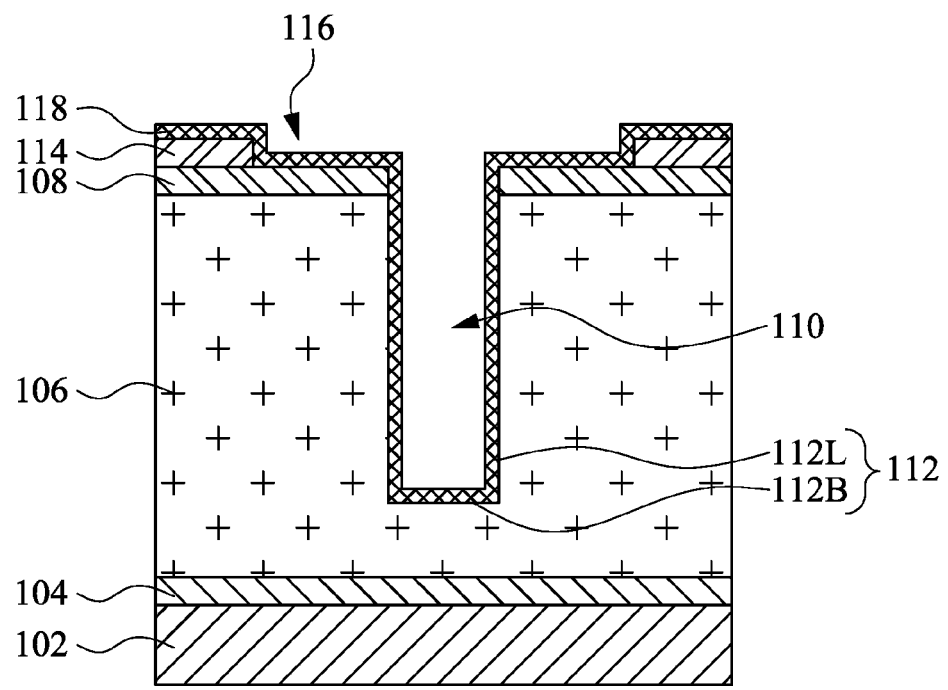

Reference is made to FIG. 4. An anti-adhesion layer 118 is at least formed on the inner surface 112 of the recess 110. In a greater detail, the anti-adhesion layer 118 can be conformally formed on top and lateral surfaces of the mask layer 114, top and lateral surfaces of the anti-reflection layer 108, and the inner surface 112 of the recess 110. In particular, the inner surface 112 of the recess 110 includes a bottom surface 112B and a lateral surface 112L. The lateral surface 112L connects the bottom surface 112B and a top surface of the dielectric structure 106. In some embodiments, the entire lateral surface 112L and the entire bottom surface 112B are covered by the anti-adhesion layer 118. The anti-adhesion layer 118 and the dielectric structure 106 are made of different materials having different adhesion properties. More particularly, the anti-adhesion layer 118 and the dielectric structure 106 have different adhesion abilities to a byproduct of etching the liner layer 104. In detail, the anti-adhesion layer 118 and the dielectric structure 106 include different materials such that the adhesion ability of the anti-adhesion layer 118 to the byproduct of etching the liner layer 104 is weaker than the adhesion ability of the dielectric structure 106 to the byproduct of etching the liner layer 104. Therefore, the anti-adhesion layer 118 formed on the entire inner surface 112 of the recess 110 can prevent the byproduct adhered to the inner surface 112 when etching the liner layer 104 in a subsequent process, so that a size of a subsequently formed via opening is not reduced by the byproduct adhered to the inner surface 112. "Adhesion ability to the byproduct" in this context refers to the amount of the byproduct that can be adhered to per unit area of a surface. More particularly, "the adhesion ability of the anti-adhesion layer 118 to the byproduct" refers to the amount of the byproduct that can be adhered to per unit area of a surface of the anti-adhesion layer 118. Similarly, "the adhesion ability of the dielectric structure 106 to the byproduct" refers to the amount of the byproduct that can be adhered to per unit area of a surface of the dielectric structure 106. In some embodiments, a material of the anti-adhesion layer 118 is dielectric, such as silicon nitride (SiN) or silicon oxynitride (SiON), and a material of the dielectric structure 106 is different from the material of the anti-adhesion layer 118. For example, the dielectric structure 106 includes tetrathoxysilane (TEOS), an extreme low-k (ELK) dielectric material, or nitrogen-free anti-reflective coating (NFARC). By such a difference of materials of the anti-adhesion layer 118 and the dielectric structure 106, the anti-adhesion layer 118 can exhibit weaker adhesion ability than that of the dielectric structure 106. In some embodiments, the anti-adhesion layer 118 is conformally formed on the inner surface 112 of the recess 110. Formation of the anti-adhesion layer 118 may be performed by an atomic layer deposition (ALD) process, or a CVD process. For example, the anti-adhesion layer 118 may be a silicon nitride layer formed by ALD. The silicon nitride layer is formed by the ALD process including multiple silicon nitride deposition cycles, each silicon nitride deposition cycle may include contacting the surfaces of the mask layer 114, the anti-reflection layer 108 and the inner surface 112 of the recess 110 with a silicon precursor, such that the silicon precursor adsorbs on these surfaces, and contacting these surfaces with a nitrogen precursor. The silicon nitride deposition cycle may be repeated as many times as to achieve a desired thickness and composition of a silicon nitride layer. This resulting silicon nitride layer may serve as the anti-adhesion layer 118 conformally formed on the inner surface 112 of the recess 110.

Figure 5:
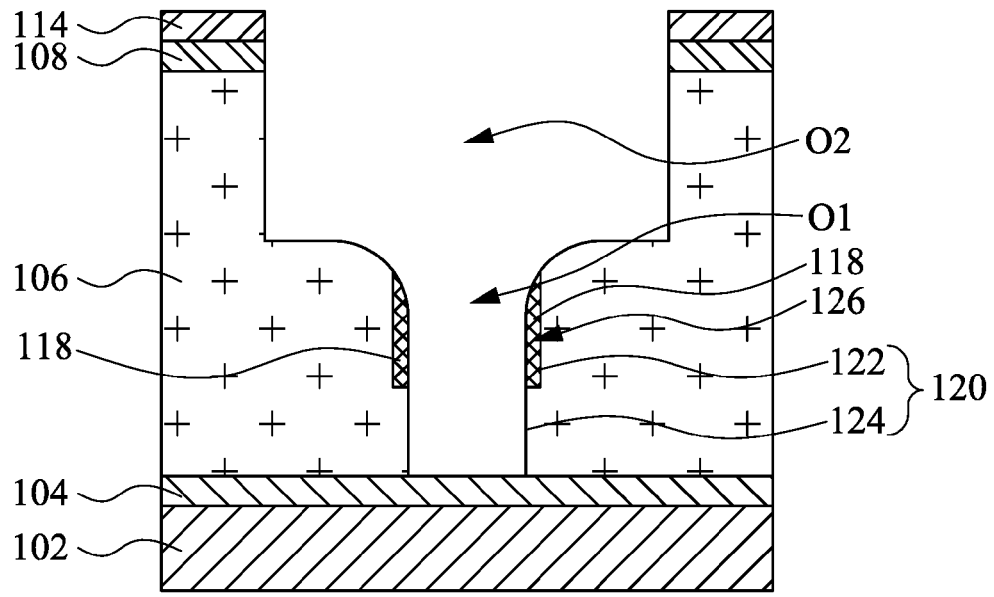

Reference is made to FIG. 5. Portions of the anti-adhesion layer 118, the anti-reflection layer 108, and the dielectric structure 106 are removed, so as to form a via opening O1 and a trench opening O2 in the dielectric structure 106, in which the via opening O1 is present between the trench opening O2 and the liner layer 104, and the via and trench openings O1 and O2 are communicated. In a greater detail, a portion of the dielectric structure 106 underlying the recess 110 in FIG. 4 is removed to form the via opening O1 that exposes the liner layer 104. In other words, the via opening O1 is deepened until reaching the liner layer 104 after forming the anti-adhesion layer 118. Moreover, the removal of this portion of the dielectric structure 106 is accompanied by formation of the trench opening O2. In other words, during the period of removing the portion of the dielectric structure 106 underlying the recess 110, another portion of the dielectric structure 106 underlying the opening 116 of the mask layer 114 is removed as well. As such, the via opening O1 and the trench opening O2 can be formed in the same process. During the removal process, the mask layer 114 prevents the portion of the dielectric structure 106 underlying thereof from being removed. In other words, formation of the trench opening O2 is removing the portion of the dielectric structure 106 not covered by the mask layer 114. The removal process can be an etching process, such as, an anisotropic etching process. The anisotropic etching process can be, for example, a $CF_4$ based or $C_4F_8$ based dry etching process.

This removal process performed in FIG. 5 forms a sidewall 120 of the via opening O1 underlying the trench opening O2. After formation of the via and trench openings O1 and O2, a portion of the anti-adhesion layer 118 remains on at least a portion of the sidewall 120 and serves as a dielectric via liner, so as to prevent the byproduct from adhered to the sidewall 120 during etching the liner layer 104 in a subsequent process. As such, reduction of the size of the via opening O1 by the byproduct of etching the liner layer 104 can be prevented.

In some embodiments, since the etching process of exposing the liner layer 104 is performed after formation of the anti-adhesion layer 118, a lower region of the via opening O1 is formed after formation of the anti-adhesion layer 118. Thus, the anti-adhesion layer 118 is absent from the lower region of the via opening O1. Stated differently, the anti-adhesion layer 118 is present on a portion of the sidewall 120. In a greater detail, the sidewall 120 includes an upper portion 122 and a lower portion 124. The lower portion 124 is present between the upper portion 122 and the non-insulator structure 102. In other words, the upper portion 122 is present between the lower portion 124 and the trench opening O2. The anti-adhesion layer 118 is present on the upper portion 122 and not on the lower portion 124. In other words, the upper portion 122 is covered by the anti-adhesion layer 118, and the lower portion 124 is not covered by the anti-adhesion layer 118. In other words, the anti-adhesion layer 118 is present on a portion of the sidewall 120 that is proximal or closest to the trench opening O2. In a greater detail, after formation of the via opening O1, a lowest portion of the lateral surface 112L of the recess 110 in FIG. 4 remains in the dielectric structure 106 and serves as the upper portion 122 of the sidewall 120, and a portion of the anti-adhesion layer 118 on the lowest portion of the lateral surface 112L of the recess 110 in FIG. 4 remains in the dielectric structure 106 as well. In some embodiments, since the anti-adhesion layer 118 is conformally formed on the lateral surface 112L by using, such as, the ALD process, the anti-adhesion layer 118 is conformal to the upper portion 122 of the sidewall 120.

In some embodiments, as shown in FIG. 5, the upper portion 122 and the lower portion 124 of the sidewall 120 are not aligned with each other because the anti-adhesion layer 118 on the upper portion 122 serves as a mask protecting the underlying dielectric structure 106 during the etching process performed in FIG. 5. In a greater detail, a distance from the upper portion 122 to a central axis of the via opening O1 is greater than a distance from the lower portion 124 to a central axis of the via opening O1. Stated differently, the sidewall 120 has a recess 126 thereon. The recess 126 is proximal to the trench opening O2. The anti-adhesion layer 118 is present in the recess 126, or more particularly, the anti-adhesion layer 118 fills the recess 126.

Figure 6:
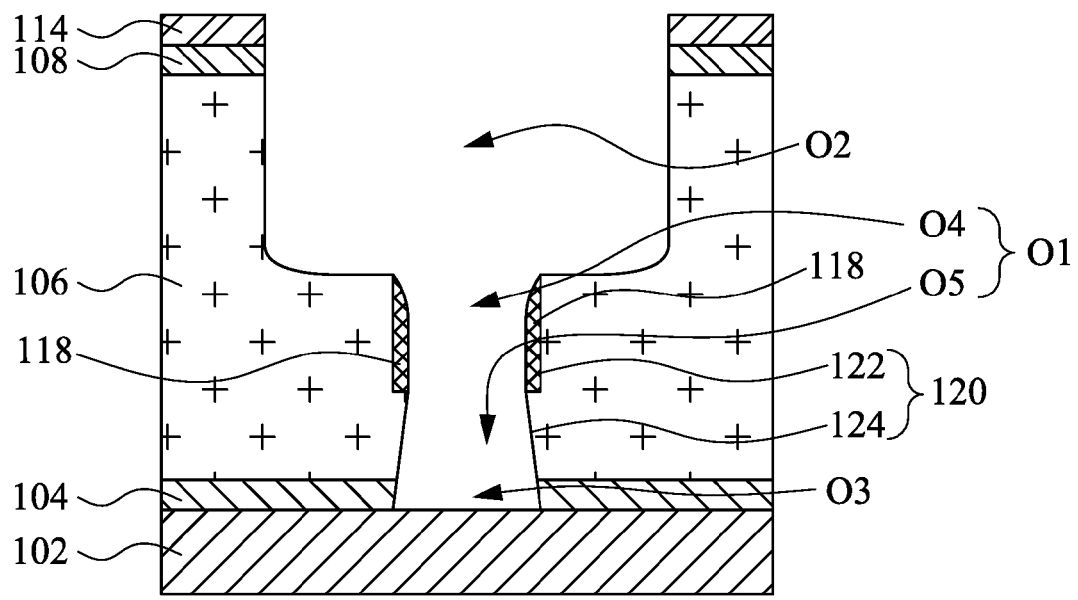

Reference is made to FIG. 6. A portion of the liner layer 104 underlying the via opening O1 is removed to form an opening O3, which allows non-insulator structure 102 exposed by the via opening O1. This liner removal process is performed such that at least a portion of the via opening O1 is expanded along a direction from the dielectric structure 106 to the non-insulator structure 102. In detail, the via opening O1 is deepened and expanded until a portion of the liner layer 104 underlying the via opening O1 is removed to form the opening O3 exposing the non-insulator structure 102. Such an expanded via opening O1 may increase the contact area between the non-insulator structure 102 and a conductor formed in the via opening O1 in a later process, thereby reducing the contact resistance. In other words, at least a portion of the via opening O1 tapers along the direction from the non-insulator structure 102 to the dielectric structure 106. In a greater detail, the via opening O1 includes a top opening O4 and a tapering opening O5 communicated with each other. The tapering opening O5 is present between the top opening O4 and the non-insulator structure 102. The tapering opening O5 tapers along a direction from the non-insulator structure 102 to the top opening O4. In other words, the tapering opening O5 expands along a direction from the dielectric structure 106 to the non-insulator structure 102. In some embodiments, the anti-adhesion layer 118 is present in the top opening O4 and absent from the tapering opening O5. In other words, the anti-adhesion layer 118 is not present in the tapering opening O5. Since the anti-adhesion layer 118 and the dielectric structure 106 have different etch properties, the shape modification of the tapering opening O5 due to the liner removal process is different from that of the top opening O4 due to the same process. More particularly, in some embodiments, the top opening O4 has a width variation less than that of the tapering opening O5 since the anti-adhesion layer 118 and the dielectric structure 106 have different etch selectivities. In other words, the anti-adhesion layer 118 has relatively high etching resistivity compared to the dielectric structure 106 during etching the liner layer 104, thereby preventing the anti-adhesion layer 118 from damaged by the etching the liner layer 104, and therefore, the top opening O4 having the anti-adhesion layer 118 therein has the width variation less than that of the tapering opening O5. In some embodiments, the top opening O4 does not taper and the tapering opening O5 tapers. In other words, the tapering opening O5 has a width decreasing along the direction from the non-insulator structure 102 toward the top opening O4, and the top opening O4 has a substantially constant width.

In some embodiments, the opening O3 of the liner layer 104 exposes the non-insulator structure 102. Since the anti-adhesion layer 118 has the adhesion ability to the byproduct of etching the opening O3 of the liner layer 104 weaker than that of the sidewall 120 of the via opening O1 of the dielectric structure 106, the anti-adhesion layer 118 on the sidewall 120 may prevent the byproduct of etching the opening O3 of the liner layer 104 from adhered to the sidewall 120 of the via opening O1 during this liner removal process, so that reduction of the size of the via opening O1 can be prevented after removing the portion of the liner layer 104. Moreover, since the anti-adhesion layer 118 and the dielectric structure 106 have different etch properties, which allows the anti-adhesion layer 118 to have relatively high etching resistivity compared to the dielectric structure 106, so that damage to the anti-adhesion layer 118 caused by etching the O3 can be reduced, and so that the size of the top opening O4 of the via opening O1 is not reduced after the liner removal process. In some embodiments, the non-insulator structure 102 includes metal, and the anti-adhesion layer 118 has an adhesion ability to the metal weaker than that of the sidewall 120 of the via opening O1 of the dielectric structure 106, so that the anti-adhesion layer 118 on the sidewall 120 may prevent the byproduct of over-etching the non-insulator 102 from adhered to the sidewall 120.

In some embodiments, the portion of the liner layer 104 underlying the via opening O1 can be removed by an isotropic dry etching process. Such an isotropic dry etching process may benefit the lower portion of the via opening O1 to expand along a direction from the dielectric structure 106 to the non-insulator structure 102. In some embodiments, the isotropic dry etching process may be an isotropic reactive-ion etching (RIE) process using $CHF_3$ as an etchant for the liner layer 104. The isotropic dry etching process may have a high selectivity such that the dry etching process may stop at the non-insulator structure 102. Therefore, unwanted etching of the non-insulator structure 102 may be reduced. The liner layer 104 may benefit forming a non-insulator structure 102 without a recess caused by the etching processes of forming the via and trench openings O1 and O2, thereby enhancing the device performance. After this liner removal process, another portion of the liner layer 104 outside the via opening O1 remains between the dielectric structure 106 and the non-insulator structure 102. Since the anti-adhesion layer 118 is absent from the lower portion 124 of the sidewall 120, the lower portion 124 may be shaped as tapering along the direction from the opening O3 of the liner layer 104 to the top opening O4 of the via opening O1. Further, the anti-adhesion layer 118 is not in contact with the remaining liner layer 104. In other words, the anti-adhesion layer 118 is separated from the remaining liner layer 104. More particularly, the anti-adhesion layer 118 and the remaining liner layer 104 are separated by the lower tapering portion 124 of the sidewall 120 of the dielectric structure 106.

Figure 7:
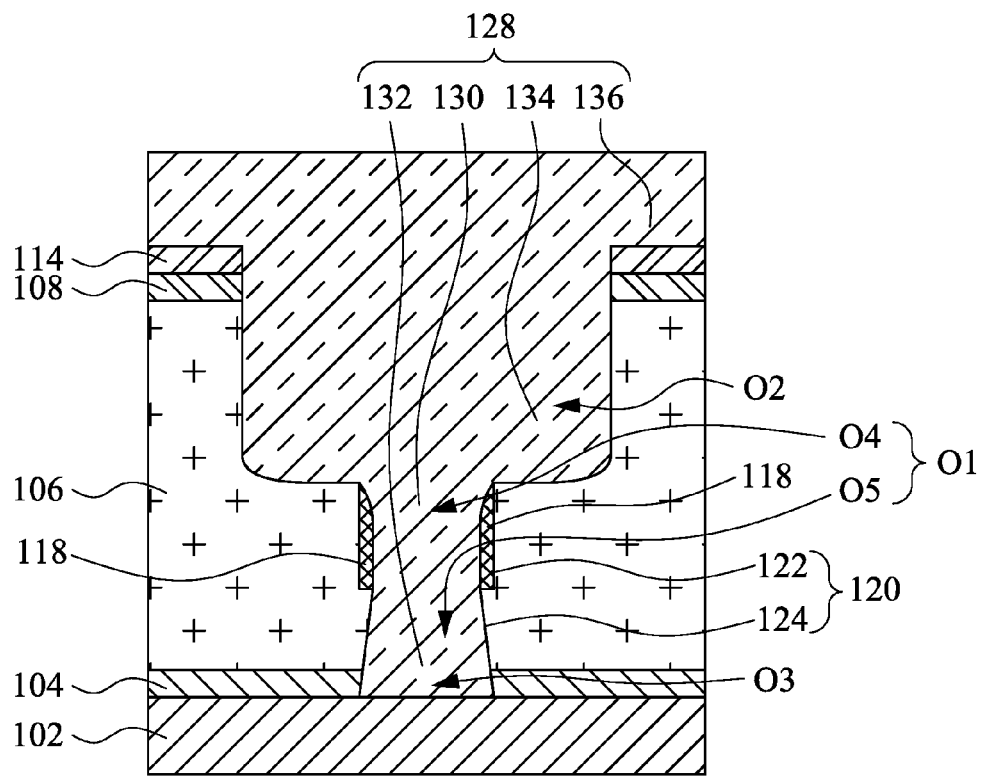

Reference is made to FIG. 7. A conductive structure 128 is formed in the via opening O1 and the trench opening O2 and passes through the opening O3 of the liner layer 104 to electrically connect to the non-insulator structure 102. The anti-adhesion layer 118 is present between a sidewall 120 of the via opening O1 and the conductive structure 128. In some embodiments, the anti-adhesion layer 118 is present between the upper portion 122 of the sidewall 120 and the conductive structure 128. In a greater detail, the anti-adhesion layer 118 contacts with the upper portion 122 of the sidewall 120 and the conductive structure 128. By such a configuration, the upper portion 122 of the sidewall 120 and the conductive structure 128 are separated by the anti-adhesion layer 118. In other words, the upper portion 122 of the sidewall 120 is not in contact with the conductive structure 128. Since the anti-adhesion layer 118 is absent from the lower tapering portion 124 of the sidewall 120, the lower tapering portion 124 of the sidewall 120 contacts with the conductive structure 128. In other words, the anti-adhesion layer 118 and the lower tapering portion 124 of the sidewall 120 are respectively present on different portions of the conductive structure 128.

In some embodiments, at least portion of the conductive structure 128 fills the tapering opening O5, so that this portion of the conductive structure 128 is conformal to the lower tapering portion 124 of the sidewall 120. In other words, at least a portion of the conductive structure 128 tapers along the direction from the non-insulator structure 102 to the dielectric structure 106. Stated differently, this portion of the conductive structure 128 expands toward the non-insulator structure 102, which may benefit increasing the contact area between the conductive structure 128 and the non-insulator structure 102, thereby reducing the contact resistance. More particularly, the conductive structure 128 includes a first portion 130 and a second portion 132. The second portion 132 is present between the first portion 130 and the non-insulator structure 102. The anti-adhesion layer 118 is absent between lower tapering portion 124 of the sidewall 120 and the second portion 132 of the conductive structure 128, so that the second portion 132 may be a tapering portion that tapers along the direction from the non-insulator structure 102 to the dielectric structure 106. In other words, the second portion 132 of the conductive structure 128 is conformally received in the tapering opening O5 of the via opening O1. In some embodiments, the anti-adhesion layer 118 is present between the upper portion 122 of the sidewall 120 and the first portion 130 of the conductive structure 128, and therefore, the first portion 130 has the width variation less than that of the second portion 132 since the anti-adhesion layer 118 on which the first portion 130 is formed has the relatively high etching resistivity compared to the dielectric structure 106. In some embodiments, the first portion 130 does not taper and the second portion 132 tapers. In a greater detail, the second portion 132 has a width decreasing along the direction from the non-insulator structure 102 toward the first portion 130, and the first portion 130 has a substantially constant width.

In some embodiments, the conductive structure 128 includes TiN, TaN, Ta, Ti, Hf, Zr, Ni, W, Co, Cu, or Al. In some embodiments, the conductive structure 128 may be formed by CVD, PVD, plating, ALD, or other suitable techniques. In some embodiments, the conductive structure 128 may include a laminate. The laminate may further include a barrier metal layer, a linear metal layer or a wetting metal layer. Further, the thickness of the conductive structure 128 depends on the depth of the via and trench openings O1 and O2. The conductive structure 128 is deposited until the via and trench openings O1 and O2 are substantially filled or overfilled.

In some embodiments, when the conductive structure 128 overfills the trench opening O2, the conductive structure 128 may further include a trench-filling portion 134 and an overfilling portion 136. The trench-filling portion 134 connects and is present between the first portion 130 and the overfilling portion 136. The trench-filling portion 134 fills the trench opening O2. The first portion 130 and the second portion 132 fills the via opening O1 and contacts with the non-insulator structure 102 through the opening O3 of the liner layer 104. The overfilling portion 136 overfills the trench opening O2 and caps the mask layer 114.

Figure 8:
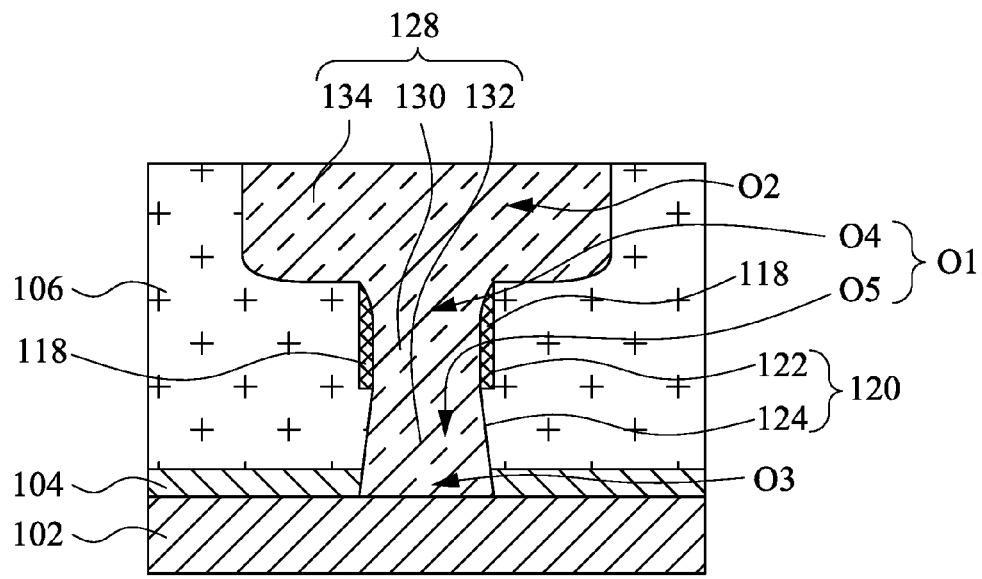

Reference is made to FIG. 8. A chemical-mechanical polishing (CMP) process is performed to planarize the conductive structure 128 after filling the via opening O1 and the trench opening O2. The CMP process removes the overfilling portion 136 of the conductive structure 128 outside of trench opening O2, the CMP process may stop when reaching the dielectric structure 106, and thus providing a substantially planar surface. The CMP process removes the anti-reflection layer 108 and the mask layer 114.

In some embodiments, at least a portion of the conductive structure tapers along the direction from the non-insulator structure to the dielectric structure. In other words, the conductive structure expands toward the non-insulator structure. Therefore, the contact area between the conductive structure and the non-insulator structure can be increased, so that the contact resistance can be reduced.

According to some embodiments, an interconnection structure includes a non-insulator structure, a liner layer, a dielectric structure and a conductive structure. The liner layer is present on the non-insulator structure and has an opening therein. The dielectric structure is present on the liner layer. The dielectric structure includes a via opening therein. The conductive structure is present in the via opening of the dielectric structure and electrically connected to the non-insulator structure through the opening of the liner layer. At least a portion of the conductive structure tapers along a direction from the non-insulator structure to the dielectric structure.

According to some embodiments, an interconnection structure includes a non-insulator structure, a liner layer, a dielectric structure and a conductive structure. The liner layer is present on the non-insulator structure and has an opening therein. The dielectric structure is present on the liner layer. The dielectric structure includes a via opening therein. The conductive structure is present in the via opening of the dielectric structure and electrically connected to the non-insulator structure through the opening of the liner layer. The conductive structure includes a first portion and a second portion present between the first portion and the non-insulator structure. The second portion has a width variation greater than that of the first portion.

According to some embodiments, a method of forming an interconnection structure includes forming a liner layer on a non-insulator structure, forming a dielectric structure on the liner layer, forming a via opening through the dielectric structure into the liner layer such that at least a portion of the via opening is tapered along a direction from the non-insulator structure to the dielectric structure, and forming a conductive structure in the via opening, in which the conductive structure is electrically connected to the non-insulator structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnection structure, comprising:
a non-insulator structure;
a liner layer present on the non-insulator structure and having an opening therein;
a dielectric structure present on the liner layer, the dielectric structure comprising a via opening therein;
an anti-adhesion layer; and
a conductive structure present in the via opening of the dielectric structure and electrically connected to the non-insulator structure through the opening of the liner layer, at least a portion of the conductive structure tapering along a direction from the non-insulator structure to the dielectric structure, and wherein the anti-adhesion layer is present between a sidewall of the via opening and the conductive structure.

2. The interconnection structure of claim 1, wherein the conductive structure comprises a tapering portion tapering along the direction from the non-insulator structure to the dielectric structure, and the anti-adhesion layer is absent between the sidewall of the via opening and the tapering portion.

3. The interconnection structure of claim 1, wherein the conductive structure comprises a first portion and a second portion present between the first portion and the non-insulator structure, wherein the first portion has a width variation less than that of the second portion, and the anti-adhesion layer is present between the sidewall of the via opening and the first portion.

4. The interconnection structure of claim 1, wherein the anti-adhesion layer and the dielectric structure have different etch properties.

5. The interconnection structure of claim 1, wherein the anti-adhesion layer has an adhesion ability to a byproduct of etching the opening of the liner layer weaker than that of the sidewall of the via opening of the dielectric structure.

6. The interconnection structure of claim 1, wherein the non-insulator structure comprises metal, and the anti-adhesion layer has an adhesion ability to the metal weaker than that of the sidewall of the via opening of the dielectric structure.

7. The interconnection structure of claim 1, wherein at least a portion of the via opening of the dielectric structure tapers along the direction from the non-insulator structure to the dielectric structure.

8. The interconnection structure of claim 1, wherein the via opening comprises a top opening and a tapering opening present between the top opening and the non-insulator structure, and the tapering opening tapers along a direction from the non-insulator structure to the top opening.

9. The interconnection structure of claim 8, wherein the anti-adhesion layer is present in the top opening and absent from the tapering opening.

10. The interconnection structure of claim 1, wherein a sidewall of the liner layer in contact with the conductive structure is tapered.

11. The interconnection structure of claim 1, wherein the conductive structure is in contact with the dielectric structure and in contact with the anti-adhesion layer.

12. An interconnection structure, comprising:
a non-insulator structure;
a liner layer present on the non-insulator structure and having an opening therein;
a dielectric structure present on the liner layer, the dielectric structure comprising a via opening therein; and
a conductive structure present in the via opening of the dielectric structure and electrically connected to the non-insulator structure through the opening of the liner layer, the conductive structure comprising a first portion and a second portion present between the first portion and the non-insulator structure, wherein the second portion has a width variation greater than that of the first portion.

13. The interconnection structure of claim 12, wherein the second portion tapers along a direction from the non-insulator structure to the dielectric structure.

14. The interconnection structure of claim 12, further comprising:
a dielectric via liner present between the first portion of the conductive structure and the dielectric structure.

15. The interconnection structure of claim 14, wherein the dielectric via liner is absent between the second portion of the conductive structure and the dielectric structure.

16. The interconnection structure of claim 12, wherein at least a portion of the via opening tapers along a direction from the non-insulator structure to the dielectric structure, and the second portion of the conductive structure is received in the portion of the via opening.

17. A method of forming an interconnection structure, comprising:
forming a liner layer on a non-insulator structure;
forming a dielectric structure on the liner layer;
forming a via opening through the dielectric structure into the liner layer such that at least a portion of the via opening is tapered along a direction from the non-insulator structure to the dielectric structure, wherein the forming the via opening comprises:
forming the via opening in the dielectric structure;
forming an anti-adhesion layer on at least one sidewall of the via opening; and
deepening and expanding the via opening until removing a portion of the liner layer underlying the via opening; and
forming a conductive structure in the via opening, wherein the conductive structure is electrically connected to the non-insulator structure.

18. The method of claim 17, wherein the anti-adhesion layer has an adhesion ability to a byproduct of the removing the portion of the liner layer weaker than that of the sidewall of the via opening of the dielectric structure.

19. The method of claim 17, wherein the anti-adhesion layer and the dielectric structure have different etch properties such that different portions of the via opening have different width variations after the deepening and expanding the via opening.

20. The method of claim 17, further comprising:
forming a trench opening in the dielectric structure after the forming the anti-adhesion layer, wherein the trench opening communicates with the via opening.

* * * * *